United States Patent
Chang et al.

(10) Patent No.: US 10,977,409 B1
(45) Date of Patent: Apr. 13, 2021

(54) APPARATUS AND METHOD OF GENERATING A LAYOUT FOR A SEMICONDUCTOR DEVICE

(71) Applicant: Taiwan Semiconductor Manufacturing Co., Ltd., Hsinchu (TW)

(72) Inventors: Ruey-Wen Chang, Hsinchu (TW); Feng-Ming Chang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/796,900

(22) Filed: Feb. 20, 2020

Related U.S. Application Data

(60) Provisional application No. 62/927,129, filed on Oct. 29, 2019.

(51) Int. Cl.
| | |
|---|---|
| *G06F 30/3323* | (2020.01) |
| *G06F 30/392* | (2020.01) |
| *H01L 27/02* | (2006.01) |
| *H01L 29/786* | (2006.01) |
| *H01L 27/11* | (2006.01) |
| *H01L 29/06* | (2006.01) |
| *H01L 29/423* | (2006.01) |
| *H01L 27/092* | (2006.01) |

(52) U.S. Cl.
CPC ........ *G06F 30/392* (2020.01); *G06F 30/3323* (2020.01); *H01L 27/0207* (2013.01); *H01L 27/092* (2013.01); *H01L 27/1108* (2013.01); *H01L 29/0673* (2013.01); *H01L 29/42392* (2013.01); *H01L 29/78696* (2013.01)

(58) Field of Classification Search
CPC ............... G06F 30/392; G06F 30/3323; H01L 27/1108; H01L 29/78696; H01L 27/092; H01L 29/0673; H01L 29/42392; H01L 27/0207
See application file for complete search history.

(56) References Cited

U.S. PATENT DOCUMENTS

| | | | |
|---|---|---|---|
| 8,881,084 B2 * | 11/2014 | Shen | G06F 30/398 716/122 |
| 9,209,247 B2 | 12/2015 | Colinge et al. | |
| 9,236,267 B2 | 1/2016 | De et al. | |
| 9,412,817 B2 | 8/2016 | Yang et al. | |

(Continued)

*Primary Examiner* — Nghia M Doan
(74) *Attorney, Agent, or Firm* — JCIPRNET

(57) ABSTRACT

A method of generating a layout for a semiconductor device includes the following step. A first layout having a first well region and second well regions is received. Mandrel blocking regions is defined in the first layout. First mandrels are generated outside of the mandrel blocking regions. Active structures are generated to overlap with the first mandrels in the second well region, and a width of the active structures in the second well region is adjusted. Second mandrels are generated in the first well region on two opposite sides of the first mandrels. Active structures are generated to overlap with the second mandrel in the first well region, and a width of the active structures in the first well region is adjusted. A second layout is generated based on the active structures located in the first well region and the second well regions.

20 Claims, 11 Drawing Sheets

(56) References Cited

U.S. PATENT DOCUMENTS

| | | |
|---|---|---|
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2019/0131139 A1* | 5/2019 | Oh .................... H01L 21/3086 |

* cited by examiner

US 10,977,409 B1

APPARATUS AND METHOD OF GENERATING A LAYOUT FOR A SEMICONDUCTOR DEVICE

CROSS-REFERENCE TO RELATED APPLICATION

This application claims the priority benefit of U.S. provisional application Ser. No. 62/927,129, filed on Oct. 29, 2019. The entirety of the above-mentioned patent application is hereby incorporated by reference herein and made a part of this specification.

BACKGROUND

Static random access memory (SRAM) has been widely used as a representative memory for logic integrated circuits. This is because SRAM array operates fast as logic circuits operate, and consumes a significantly low power at standby mode. In general, a layout topology of a fin field-effect transistor (FinFET) SRAM cell is different from a layout topology of a nanosheet SRAM cell. Different design rules are needed to meet the requirements of these different SRAM layouts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
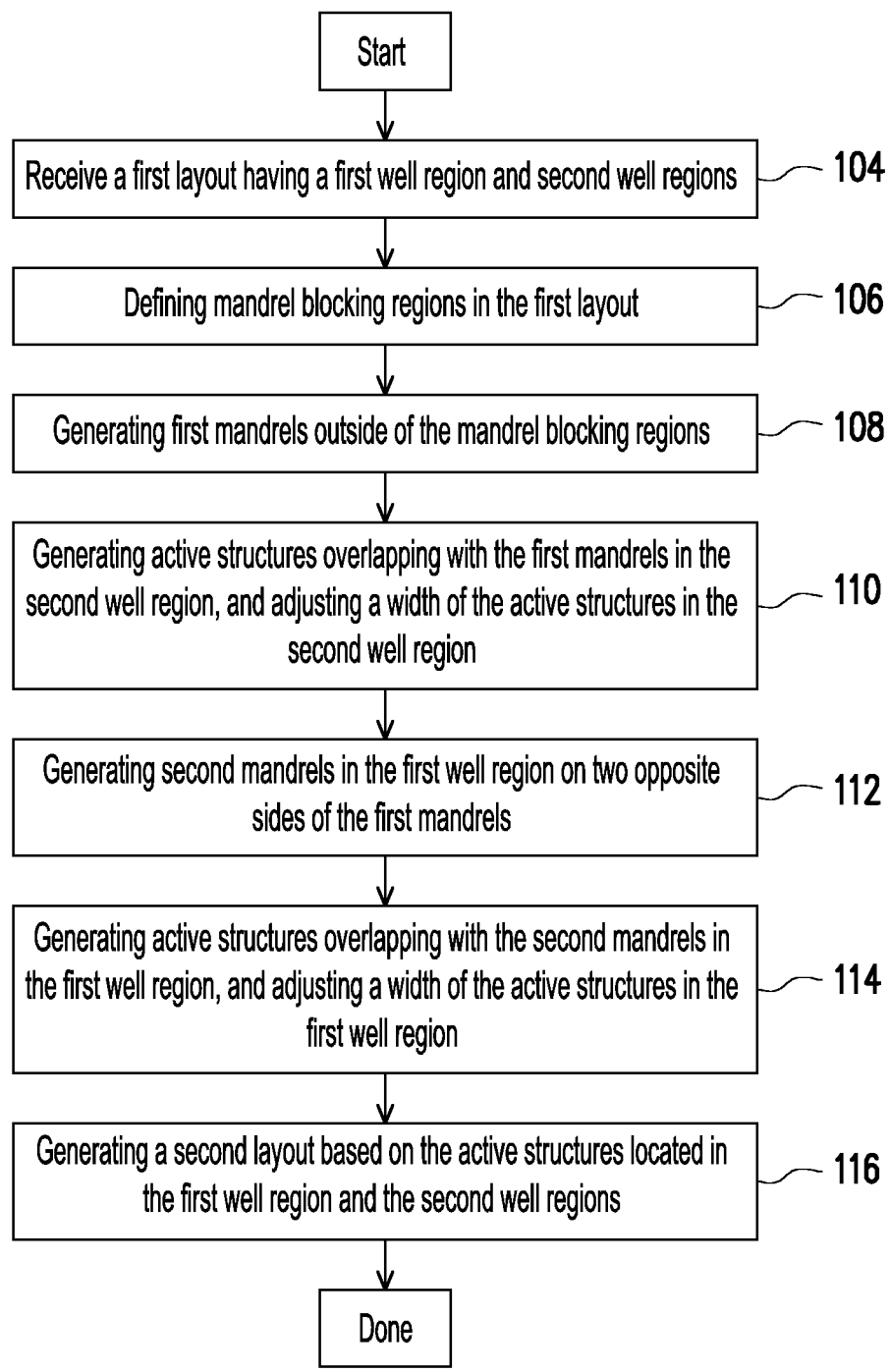
FIG. 1 is a flow chart of a method for generating a layout for a semiconductor device in accordance with some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 is a flow chart of a method for generating a layout for a semiconductor device in accordance with some embodiments of the present disclosure. FIG. 2 to FIG. 9 are fragmentary top views of a portion of a layout of a semiconductor device at different stages of layout generation in accordance with some embodiments of the present disclosure. The layout generation process illustrated in FIG. 2 to FIG. 9 will be explained using the flow chart illustrated in FIG. 1.

Figure 2:
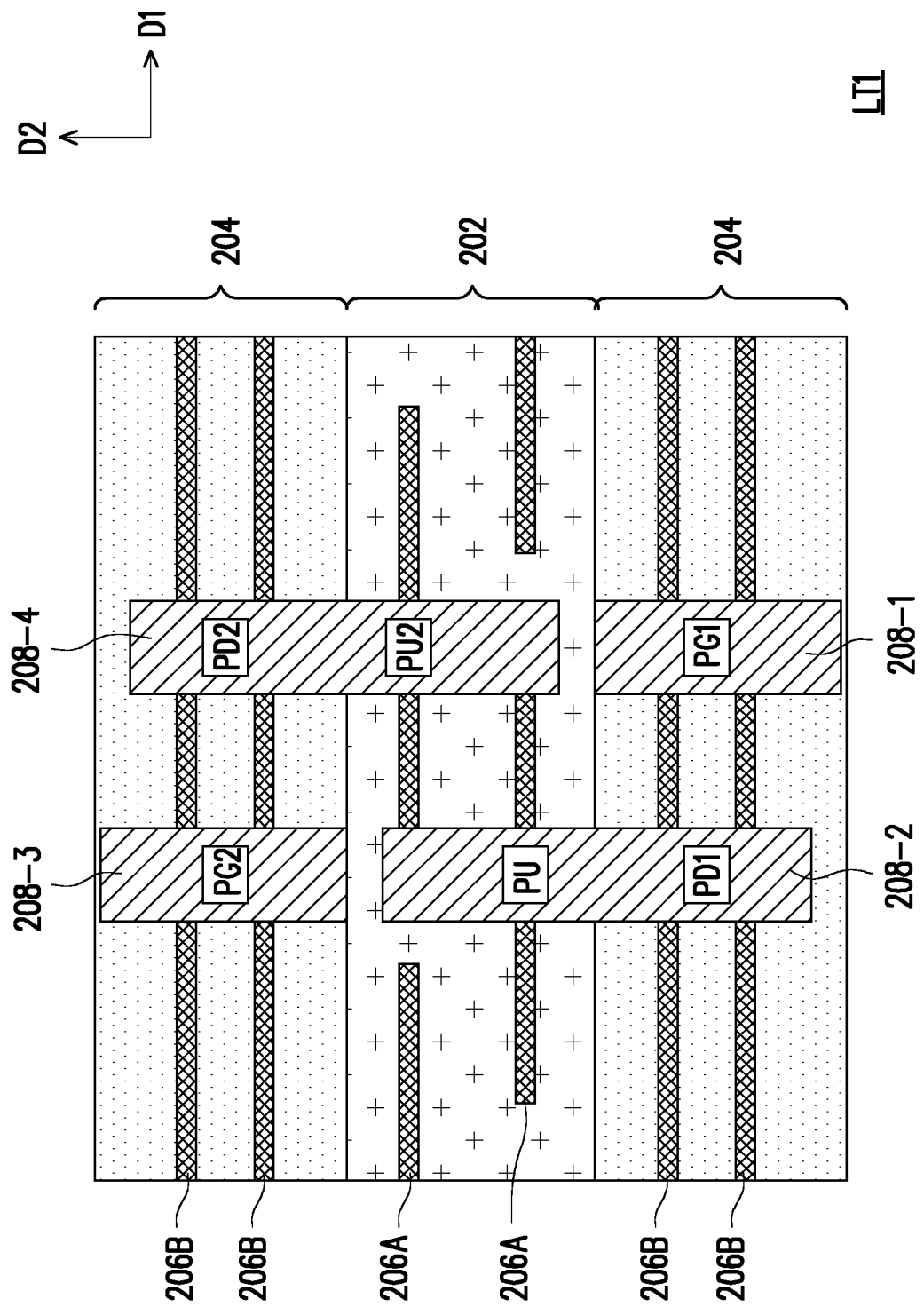
FIG. 2 to FIG. 9 are fragmentary top views of a portion of a layout of a semiconductor device at different stages of layout generation in accordance with some embodiments of the present disclosure.

Referring to FIG. 2 and in step 104 of FIG. 1, a first layout LT1 is received. In some embodiments, the first layout LT1 is any verified FinFET SRAM layout. For example, the first layout LT1 may be a six transistor (6T) SRAM cell layout or an eight transistor (8T) SRAM cell layout, or the like. The disclosure is not limited thereto. In some embodiments, the first layout LT1 is a top view of a portion of an initial layout plan for an example semiconductor device. For instance, in a FinFET device, the first layout LT1 is a portion of an initial layout plan defined as an initial FinFET region. In some embodiments, the initial layout plan may be analyzed and divide into cells, which may include one or more active areas, and grouping the cells by depth and connectivity. Cells in the different groups may be independent from each other logically. In certain embodiments, one FinFET SRAM cell is extracted and received as the first layout LT1.

As illustrated in FIG. 2, the first layout LT1 includes a first well region 202 and a plurality of second well regions 204 arranged along the second direction D2. In some embodiments, two second well regions 204 are arranged at two opposite sides of the first well region 202. In one embodiment, the first well region 202 located at the center may be N-type wells, while the second well regions 204 located at two sides may be P-type wells. However, the disclosure is not limited thereto. In some alternative embodiments, the first well region 202 located at the center may be P-type wells, while the second well regions 204 located at two sides may be N-type wells. In other words, the first well region 202 and the second well regions 204 are of opposite conductivity types.

In some embodiments, a plurality of first active structures (semiconductor fins; 206A, 206B) is arranged in the first well region 202 and the second well regions 204. For example, the plurality of first active structures (206A, 206B) may extend along a first direction D1, which is perpendicular to the second direction D2. In some embodiments, the first active structures may include first semiconductor fins 206A and second semiconductor fins 206B. The first semiconductor fins 206A and the second semiconductor fins 206B are of complementary conductivity types (N-type, P-type). In some embodiments, the first layout LT1 includes at least two first semiconductor fins 206A located in the first well region 202, and two second semiconductor fins 206B located in each of the second well regions 204.

As illustrated in FIG. 2, a gate electrode layer 208-1 is located over the channel region of the first pass-gate transistor PG1, and a gate electrode layer 208-2 is formed over the channel regions of the first pull-down transistor PD1 and the first pull-up transistor PU1. Similarly, a gate electrode layer 208-2 is located over the channel region of the second pass-gate transistor PG2, and a gate electrode layer 208-4 is formed over the channel regions of the second pull-down transistor PD2 and the second pull-up transistor PU2. In the exemplary embodiment, each bit in an SRAM may be stored on four transistors (PU1, PU2, PD1 and PD2) that form two cross-coupled inverters. In addition, two additional access transistors (PG1 and PG2) serve to control the access to a storage cell during read and write operations. In some embodiments, each of the transistors PG1, PG2, PD1 and PD2 has two fins per transistor, while the transistors PU1 and PU2 each has one fin per transistor. Other SRAM cell designs may have different number of fins per transistor than the embodiments illustrated herein.

Figure 3:
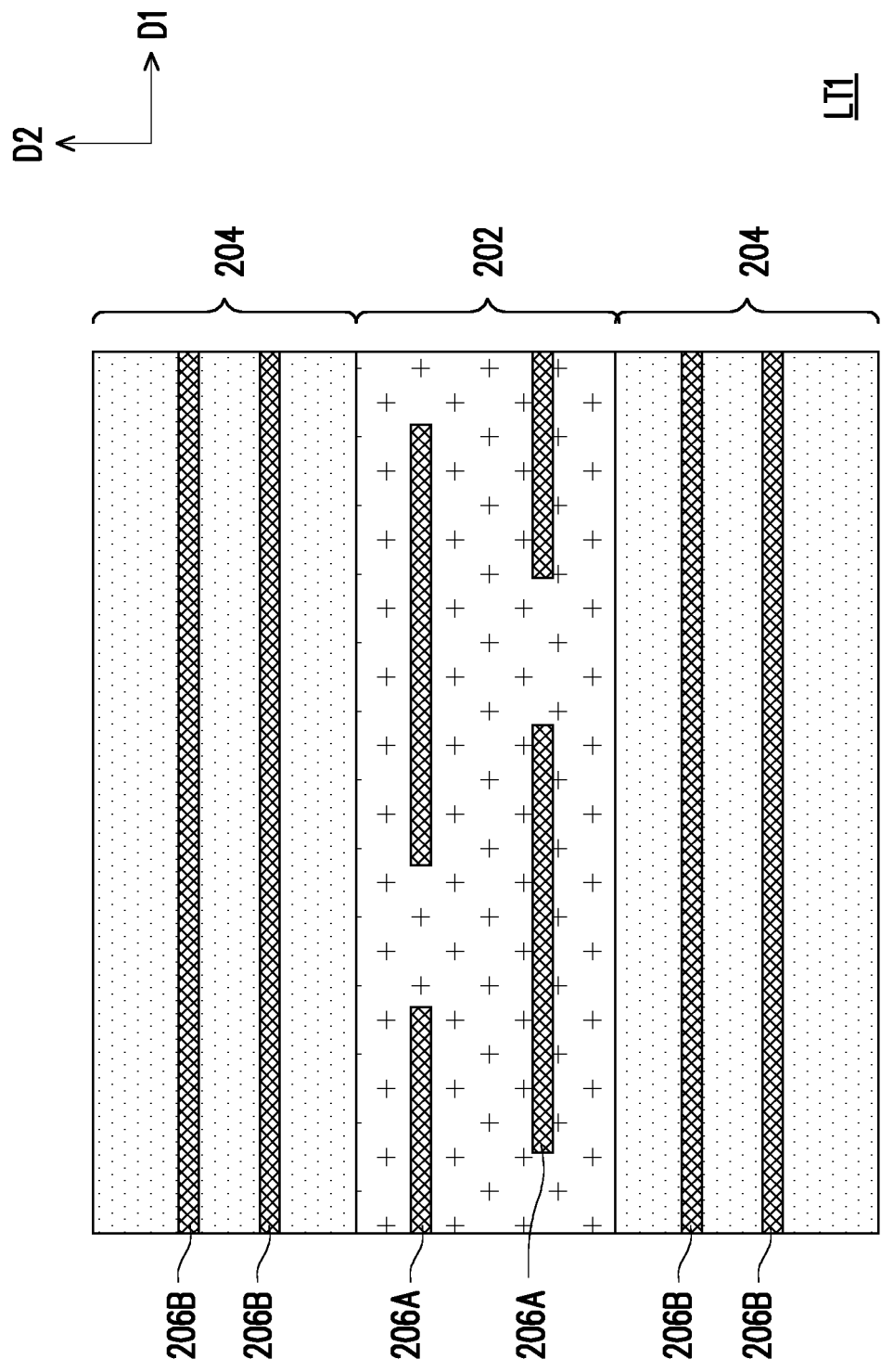

Referring to FIG. 3, in some embodiments, prior to performing a next step, the first layout LT1 may be simplified. For example, the gate electrode layers 208-1, 208-2, 208-3 and 208-4 illustrated in FIG. 2 may be omitted. In some embodiments, the step 104 shown in FIG. 1 of receiving a first layout may include receiving the simplified first layout LT1 illustrated in FIG. 3. For example, as illustrated in FIG. 3, the simplified first layout LT1 includes at least two first semiconductor fins 206A in the first well region 202, and two second semiconductor fins 206B in each of the second well regions 204. In some embodiments, the two first semiconductor fins 206A in the first well region 202 may be sectioned. The disclosure is not limited thereto.

Figure 4:
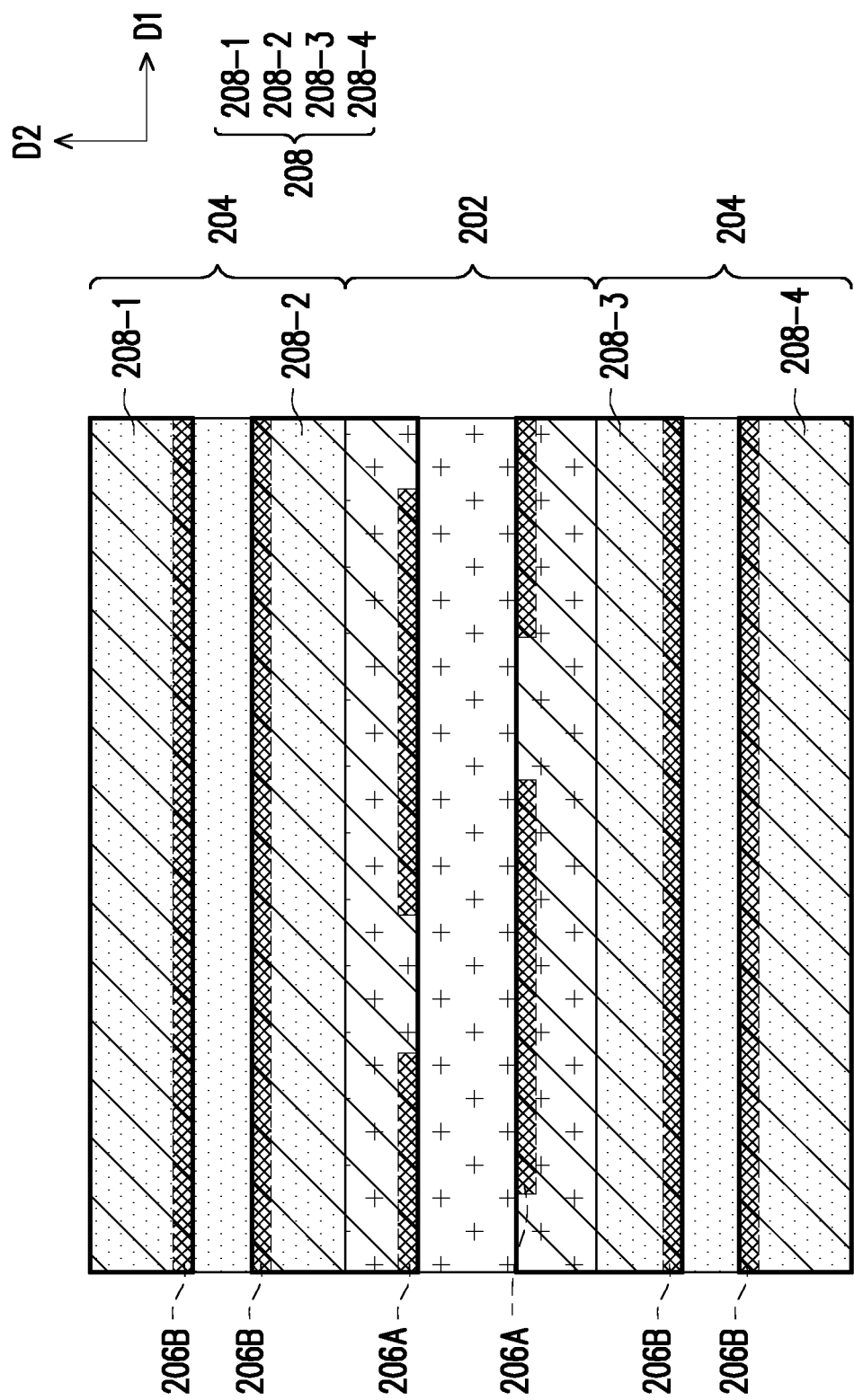

Referring to FIG. 4 and in step 106 of FIG. 1, a plurality of mandrel exposing regions 208 is defined in the first layout LT1. In some embodiments, each of the mandrel exposing regions 208 are separated from one another. In some embodiments, the plurality of mandrel exposing regions 208 corresponds to a position exposed by a mandrel used for forming the plurality of first active structures (206A, 208). For example, in general FinFET processes, the hard-mask for etching into the substrate (e.g. bulk silicon) is formed by a process using mandrels. For instance, in a method of forming active structures (or semiconductor fins) according to some embodiments, a photoresist pattern is formed and used to etch a mandrel pattern. A conformal spacer material is deposited around the mandrel. The conformal spacer is usually formed of a hard-mask material forming a spacer sidewall thinner than that of the mandrel. The mandrel material between the spacers is then removed in subsequent etching operations to leave just the spacers behind. Some of the spacers are then used as a hard-mask for etching the substrate (silicon layers) below, forming the active structures.

In the exemplary embodiment, the mandrel exposing regions 208 are regions that are outside of an area blocked by the mandrels, and corresponds to the position exposed by the mandrels used for forming the active structures as described in the above process. As illustrated in FIG. 4, in some embodiments, each of the mandrel exposing regions 208 are extending along the first direction D1, and blocks and covers two adjacent first active structures (206A, 206B). For example, the mandrel exposing region 208-1 blocks the second semiconductor fin 206B in the second well region 204, and blocks another second semiconductor fin 206B in an adjacent cell (not shown). The mandrel exposing region 208-2 blocks the second semiconductor fin 206B in the second well region 204, and blocks the first semiconductor fin 206A in the first well region 202. The mandrel exposing region 208-3 blocks the first semiconductor fin 206A in the first well region 202, and blocks the second semiconductor fin 206B in the second well region 204. Similarly, the mandrel exposing region 208-4 blocks the second semiconductor fin 206B in the second well region 204, and blocks another second semiconductor fin 206B in an adjacent cell (not shown). In certain embodiments, the mandrel exposing regions 208 also covers the space in between the two adjacent first active structures (206A, 206B).

Figure 5:
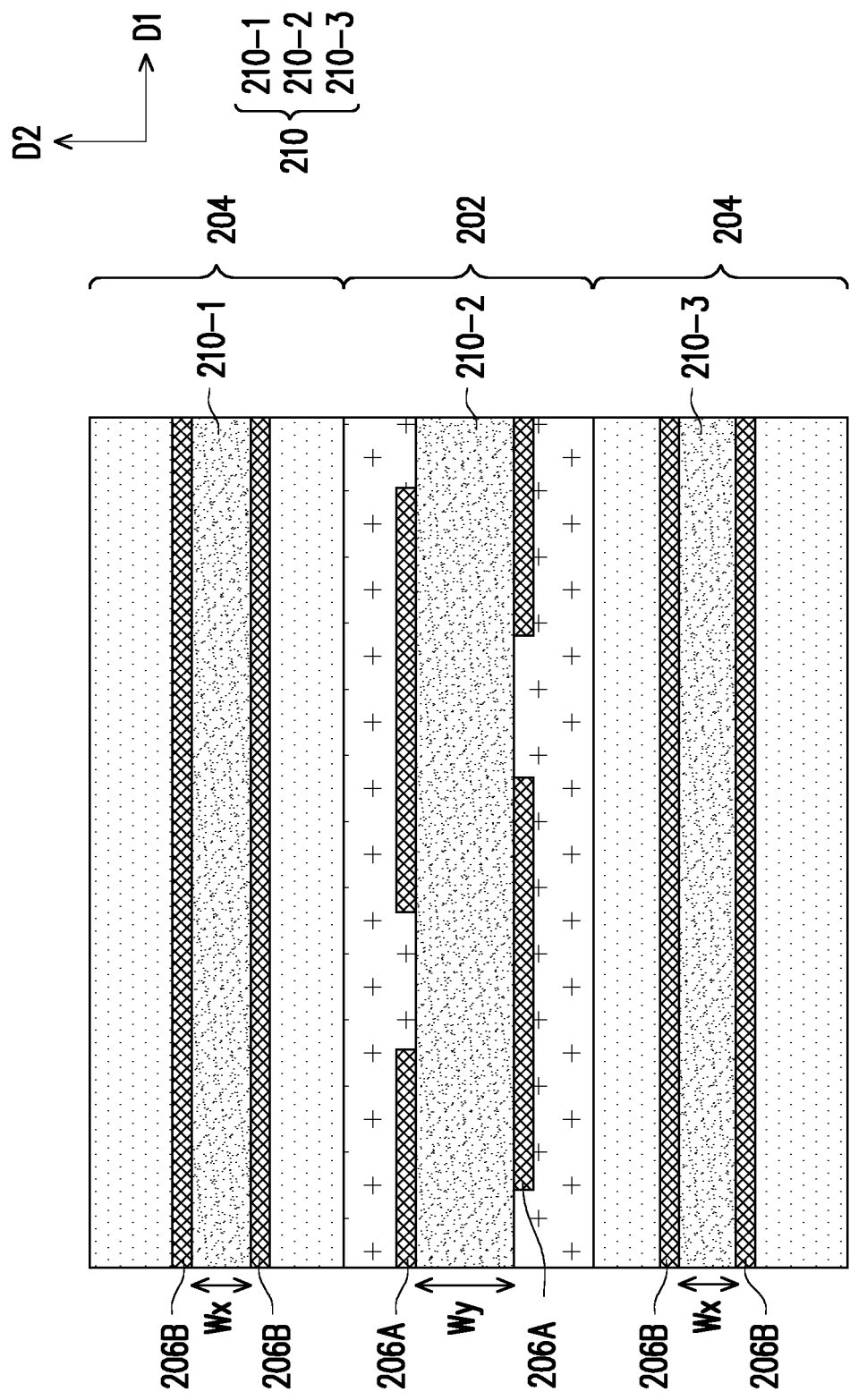

Referring to FIG. 5 and in step 108 of FIG. 1, a plurality of first mandrels 210 is generated in the first well region 202 and the plurality of second well regions 204. For example, the first mandrels 210 are generated in the first well region 202 and the second well regions 204 outside of the plurality of mandrel blocking regions 208 (shown in FIG. 4). In some embodiments, the first mandrel 210-1 is generated between the mandrel exposing region 208-1 and the mandrel exposing region 208-2. In certain embodiments, the first mandrel 210-1 is generated in between two second semiconductor fins 206B of one of the second well regions 204. In some embodiments, the first mandrel 210-2 is generated between the mandrel exposing region 208-2 and the mandrel exposing region 208-3. In certain embodiments, the first mandrel 210-2 is generated between the two first semiconductor fins 206A of the first well region 202. In some embodiments, the first mandrel 210-3 is generated between the mandrel exposing region 208-3 and the mandrel exposing region 208-4. In certain embodiments, the first mandrel 210-3 is generated between two second semiconductor fins 206B of another one of the second well regions 204.

In the exemplary embodiment, one first mandrel (210-1, 210-2 or 210-3) is generated in each of the first well region 202 and the second well regions 204. In other words, in a case where one first well region 202 and two second well regions 204 exists, a total of three first mandrels 210 are generated. Furthermore, as illustrated in FIG. 5, the first mandrels 210-1 and 210-3 located in the second well regions 204 may have a width of Wx, while the first mandrel 210-2 located in the first well region 202 may have a width of Wy. In some embodiments, the width Wx equals to a distance between the two second semiconductor fins 206B located in each of the second well regions 204. In some embodiments, the width Wy equals to a distance between the two first semiconductor fins 206A located in the first well region 202.

In some embodiments, after generating the first mandrels (210-1, 210-2 or 210-3), the mandrel exposing regions 208 may be removed.

Figure 6:
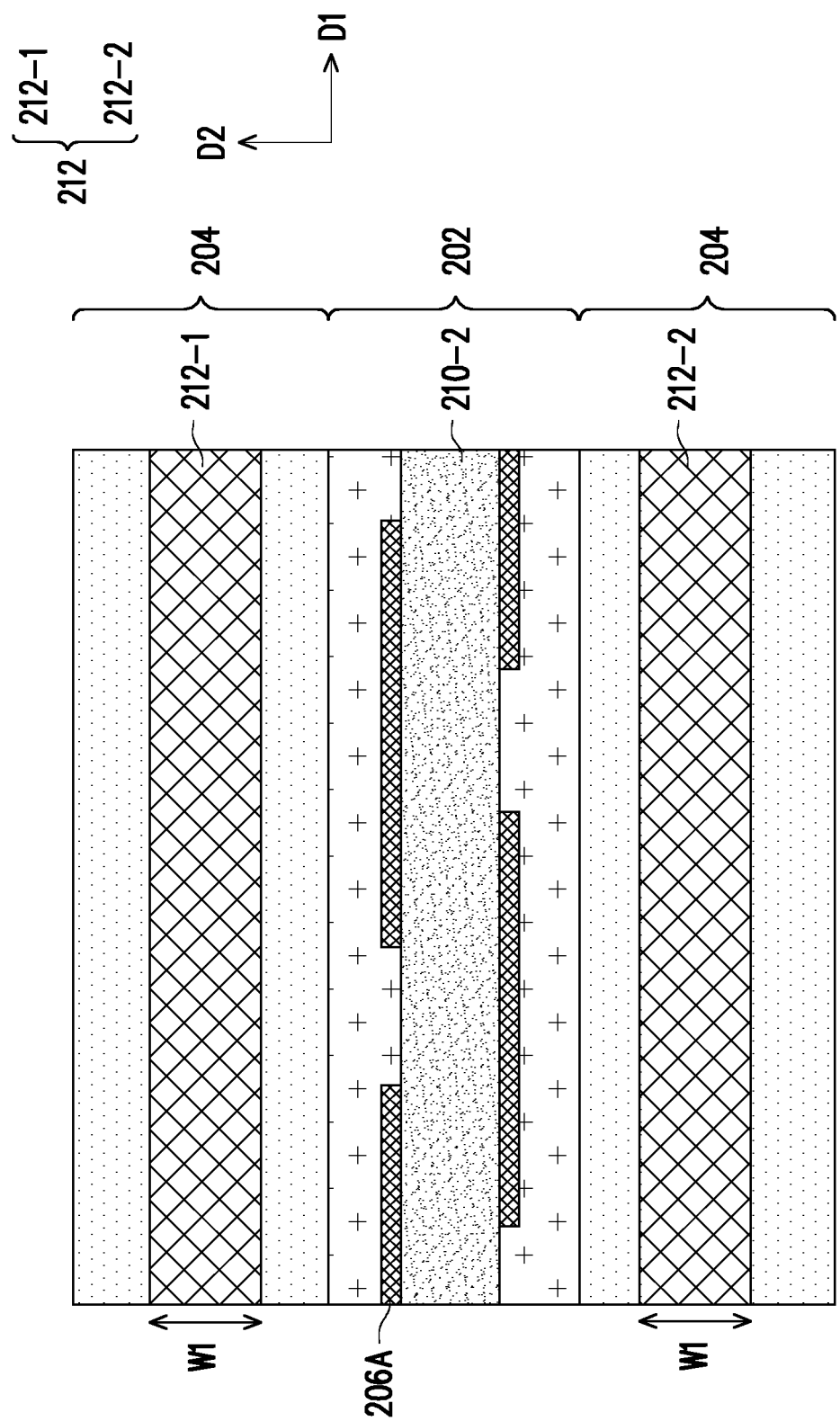

Referring to FIG. 6 and in step 110 of FIG. 1, second active structures (or first nanosheet active structures) 212 that overlaps with the plurality of first mandrels 210 located in the second well regions 204 are generated. In some embodiments, a center position of the second active structures 212 is aligned with a center position of the first mandrels 210 located in the second well regions 204 (shown in FIG. 5). For example, second active structure 212-1 is overlapped with and covering the first mandrel 210-1, while the second active structure 212-2 is overlapped with and covering the first mandrel 210-3. In some embodiments, a width of the second active structures 212-1 and 212-2 is W1, while the width of the first mandrels 210-1 and 210-3 is Wx. In the exemplary embodiment, a ratio of the width W1 to the width Wx may be in a range of 1:0.5 to 1:0.9. In other words, the width W1 of the second active structures 212-1 and 212-2 may be appropriately adjusted.

In some embodiments, the width of the second active structures 212-1 and 212-2 may be adjusted based on a first design rule check simulation. In one exemplary embodiment, adjusting the width W1 of the second active structures (or first nanosheet active structures) 212-1 and 212-2 based on the first design rule check simulation includes increasing the width W1 of the second active structures (or first nanosheet active structures) 212-1 and 212-2 so that it is greater than a width Wx of the first mandrels 210-1 and 210-3 (shown in FIG. 5). The disclosure is not limited thereto.

The design rule check simulation helps determine whether a physical layout of an integrated circuit (IC) chip satisfies a series of parameters known as design rules. Design rules set forth geometric and connectivity restrictions with respect to various components on the IC chip, so that there is sufficient margin to account for processing variations occurring during semiconductor fabrication. For example, design rules may include a width rule that specifies the minimum width of a component of the IC chip. As another example, design rules may also include a spacing rule that specifies the minimum spacing between two adjacent components of the IC chip. Numerous other design rules exist, and they are not discussed in detail herein.

In some embodiments, the design rules may include a subset of design rules for FinFET SRAM devices, and a different subset of design rule for nanosheet SRAM devices. In the exemplary embodiment, the first design rule check simulation includes checking boundaries and the width of the plurality of second active structures (or first nanosheet active structures) 212 so as to avoid a first number of nanosheet FinFET design rule violations associated with the second well regions 204. In certain embodiments, the first design rule check simulation is performed to avoid violations to the design rule for nanosheet SRAM devices.

Figure 7:
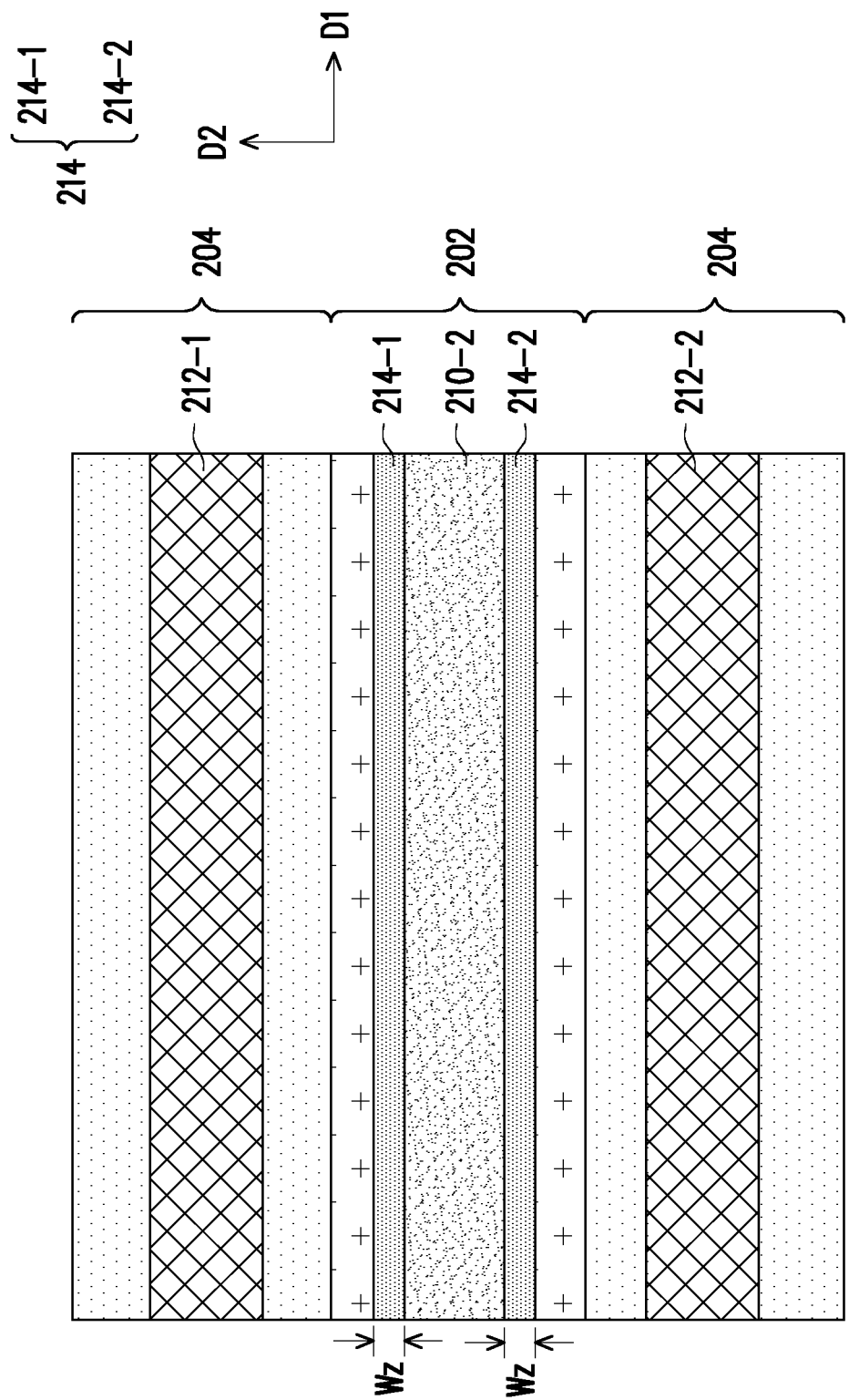

Referring to FIG. 7 and in step 112 of FIG. 1, a plurality of second mandrels 214 is generated in the first well region 202. For example, the second mandrels 214 are generated on two opposite sides of the first mandrel 210-2 located in the first well region 202. In some embodiments, the second mandrel 214-1 is located on one side of the first mandrel 210-2 and extending along the first direction D1. In some embodiments, the second mandrel 214-2 is located on another side of the first mandrel 210-2 and extending along the first direction D1. In some embodiments, the first mandrel 210-2 is sandwiched in between the second mandrel 214-1 and the second mandrel 214-2. In certain embodiments, the second mandrels 214-1 and 214-2 may be overlapped with and covering the two first semiconductor fins 206A of the first well region 202. Furthermore, in some embodiments, the second mandrels 214-1 and 214-2 located in the first well region 202 may have a width of Wz. In some embodiments, the width Wz of the second mandrels 214-1 and 214-2 may be substantially equal to or greater than a width of the first semiconductor fins 206A. The disclosure is not limited thereto.

Figure 8:
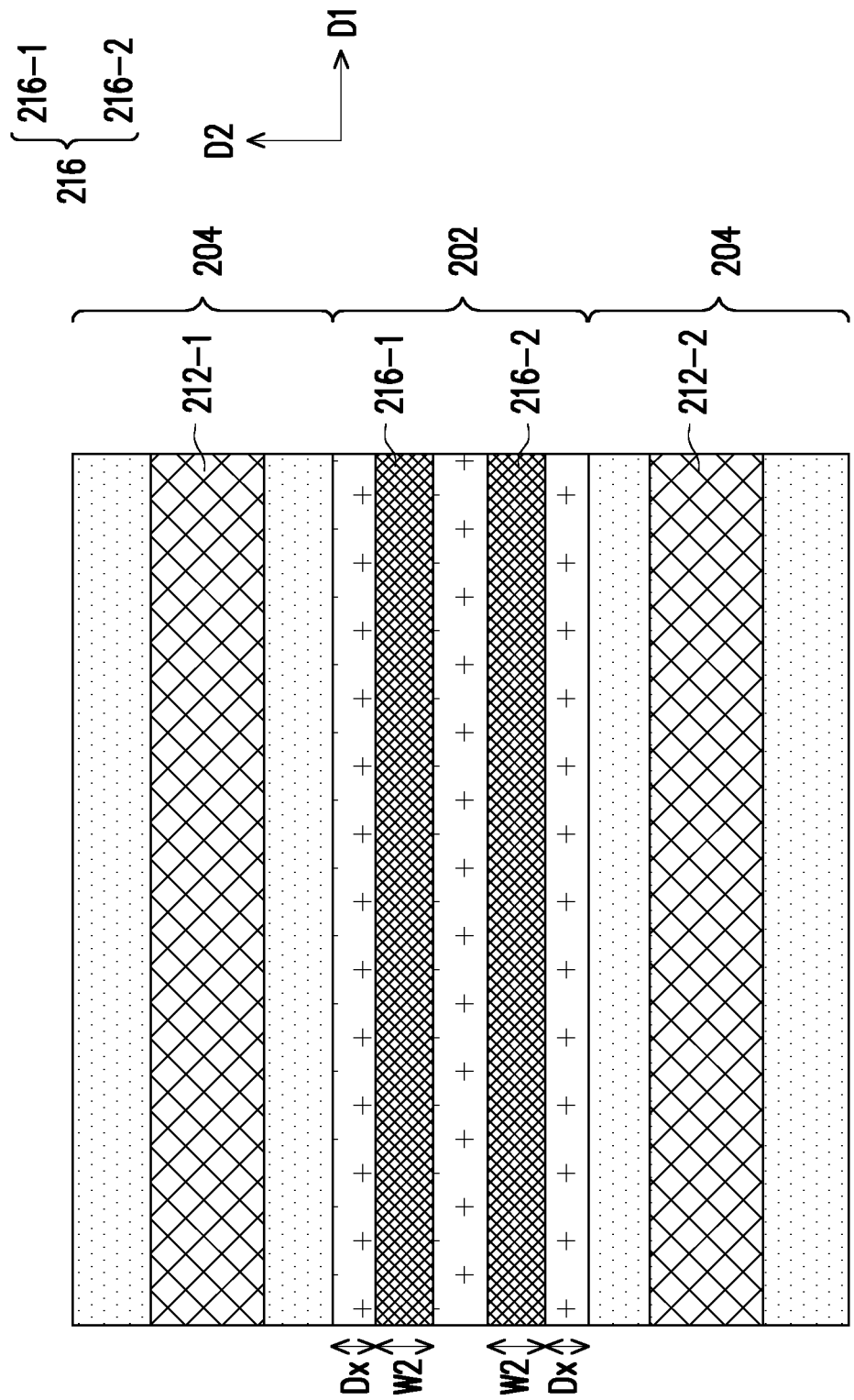

Referring to FIG. 8 and in step 114 of FIG. 1, third active structures (or second nanosheet active structures) 216 that overlaps with the plurality of second mandrels 214 (shown in FIG. 7) are generated. As illustrated in FIG. 8, the first mandrel 210-2 is omitted for ease of illustration. In some embodiments, the number of third active structures 216 generated corresponds to the number of second mandrels 214 located in the first well region 202. For example, in the exemplary embodiment, there are two second mandrels 214-1 and 214-2 located in the first well region 202, and two third active structures (or second nanosheet active structures) 216 that overlaps with the second mandrels 214 are generated.

In some embodiments, a center position of the third active structures 216 is aligned with a center position of the second mandrels 214 located in the first well region 202 (shown in FIG. 7). For example, third active structure 216-1 is overlapped with and covering the second mandrel 214-1, while the third active structure 216-2 is overlapped with and covering the second mandrel 214-2. In some embodiments, a width of the third active structures 216-1 and 216-2 is W2, while the width of the second mandrels 214-1 and 214-2 is Wz. In the exemplary embodiment, a ratio of the width Wz to the width W2 may be in a range of 1:1 to 1:3. In other words, the width of the third active structures 216-1 and 216-2 may be appropriately adjusted.

Furthermore, in some embodiments, a width of the third active structures 216-1 and 216-2 may be adjusted based on a second design rule check simulation. In one exemplary embodiment, adjusting the width W2 of the third active structures (or second nanosheet active structures) 216-1 and 216-2 based on the second design rule check simulation includes increasing the width W2 of the third active structures (or second nanosheet active structures) 216-1 and 216-2 so that it is greater than a width Wz of the second mandrels 214-1 and 214-2 (shown in FIG. 7). The disclosure is not limited thereto. In certain embodiments, the second design rule check simulation includes checking boundaries and the width of the plurality of third active structures (or second nanosheet active structures) 214 so as to avoid a second number of nanosheet FinFET design rule violations associated with the first well region 202. In certain embodiments, the second design rule check simulation is performed to avoid violations to the design rule for nanosheet SRAM devices.

In some embodiments, after adjusting the width of the third active structures 216-1 and 216-2, a distance Dx is kept between the third active structure 216-1 and a boundary of the first well region 202. Similarly, the same distance Dx is kept between the third active structure 216-2 and another boundary of the first well region 202. In some embodiments, the boundaries of the first well region 202 and the second well regions 204 may be adjusted based on the positions of the second active structures (first nanosheet active structures) 212 and the third active structures (second nanosheet active structures) 214. In other words, the distance Dx may be increased or decreased to adjust the boundaries of the first well region 202 and the second well regions 204. In certain embodiments, the boundaries of the first well region 202 and the second well regions 204 are adjusted so that a width of the first well region 202 is substantially equal to a width of each of the second well regions 204. After adjusting the boundaries of the first well region 202 and the second well regions 204, the first mandrels 210, the second mandrels 214 and the first active structures (first semiconductor fins 206A and second semiconductor fins 206B) are removed from the layout. For example, the first mandrels 210, the second mandrels 214 and the first active structures (first semiconductor fins 206A and second semiconductor fins 206B) located below the second active structures 212 and the third active structures 216 (covered up and not revealed) may be removed before the generation of a second layout.

Figure 9:
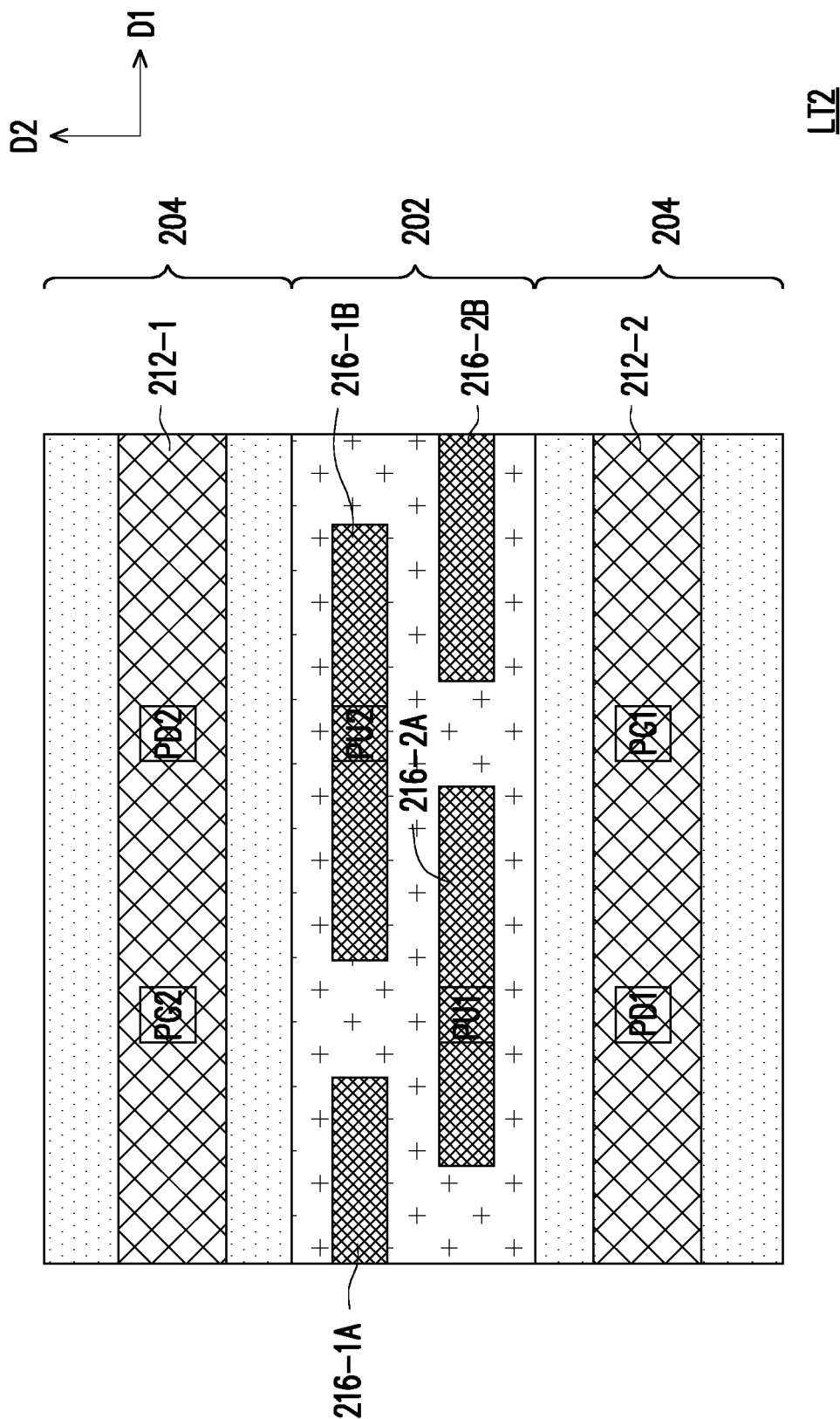

Referring to FIG. 9 and in step 116 of FIG. 1, a second layout LT2 may be generated based on the second active structures 212-1, 212-2, and the third active structures 216-1, 216-2 located in the second well regions 204 and the first well region 202. In some embodiments, prior to generating the second layout LT2, the third active structures 216-1 and 216-2 may be further sectioned to define the position of transistors. For example, the third active structure 216-1 is sectioned to have a first portion 216-1A and a second portion 216-1, while the third active structure 216-2 is sectioned to have a first portion 216-2A and a second portion 216-2B. The way of sectioning the third active structures 216-1 and 216-2 is not limited in the disclosure and may be appropriately adjusted based on design requirement.

Furthermore, in the exemplary embodiment, positions of two pull-up transistors (PU1 and PU2) are defined on the third active structures 216-1 and 216-2, while positions of two pull-down transistors (PD1 and PD2) and two pass-gate transistors (PG1 and PG2) are defined on the second active structures 212-1 and 212-2. In certain embodiments, the first pass-gate transistor PG1 and the first pull-down transistor PD1 are defined on the second active structure 212-2. In some embodiments, the second pass-gate transistor PG2 and the second pull-down transistor PD2 are defined on the second active structure 212-1. In some embodiments, the first pull-up transistor PU1 is defined on the second portion 216-1B of the third active structure 216-1, while the second pull-up transistor PU2 is defined on the first portion 216-2A of the third active structure 216-2. In the exemplary embodiment, each of the transistors (PD1, PG1, PU1, PD1, PG2 and PU2) has one fin per transistor. After defining the transistors (PD1, PG1, PU1, PD1, PG2 and PU2) on the active structures, the second layout LT2 is generated. For example, the second layout LT2 may be a nanosheet SRAM layout. Up to here a method of converting a verified FinFET SRAM layout (first layout LT1) to a nanosheet SRAM layout (second layout LT2) is accomplished.

Figure 10A:
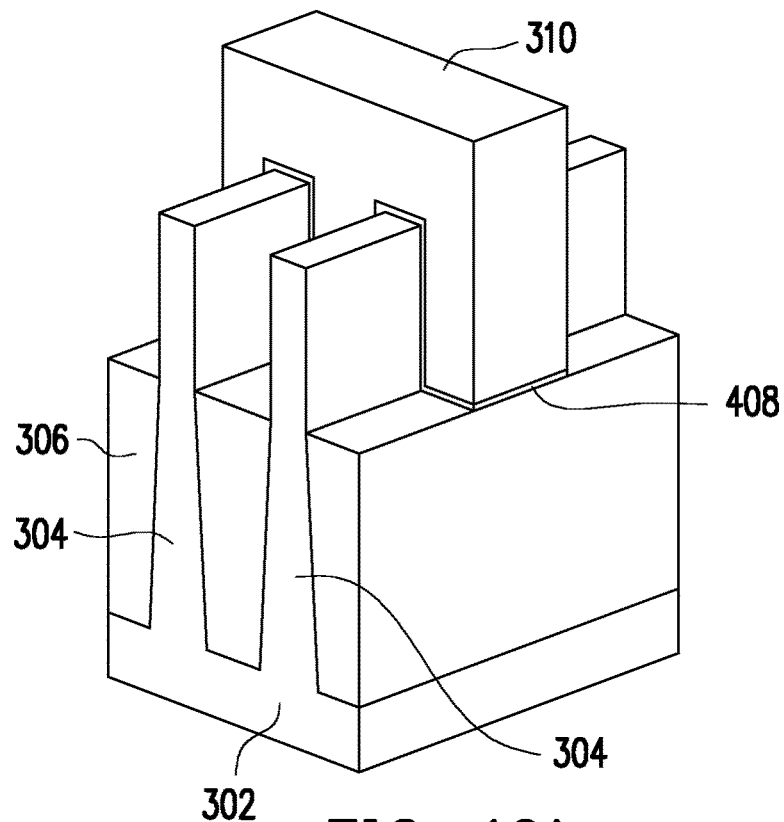
FIG. 10A is a three-dimensional perspective view of an example semiconductor device in accordance with some embodiments of the present disclosure.

FIG. 10A is a three-dimensional perspective view of an example semiconductor device in accordance with some embodiments of the present disclosure. In the exemplary method described above, the first layout LT1 is a FinFET SRAM layout having the structures illustrated in FIG. 10A. For example, FIG. 10A is a perspective view of a FinFET device at an intermediate stage of fabrication. In some embodiments, the FinFET device includes a substrate 302 having a plurality of fins 304. In some embodiments, the substrate 302 includes a silicon substrate, a silicon-on-insulator (SOI) substrate, a silicon germanium substrate, or a suitable semiconductor substrate. Other semiconductor materials including group III, group IV, and group V elements may also be used. The substrate 302 may also comprise various doped regions depending on design requirements (e.g., p-type substrate or n-type substrate). The disclosure is not limited thereto. In some embodiments, the fins 304 may be formed by etching the substrate 302. In the exemplary embodiment, the fins 304 may correspond to the first active structures (206A, 206B) illustrated in the first layout LT1 shown in FIG. 2 and FIG. 3.

As further illustrated in FIG. 10A, a plurality of insulators 306 may be formed on the substrate 302 in between the fins 304. In some embodiments, the insulators 306 covers a portion of the fins 304, while another portion of the fins 304 protrudes out from the insulators 306. In some embodiments, a gate dielectric layer 308 and gate electrode layer 311 may be formed across the fins 304. For example, the gate dielectric layer 308 is formed of a high dielectric constant (high-k) dielectric material. The exemplary high-k materials may have k values greater than about 4.0, or even greater than about 7.0, and may include aluminum-containing dielectrics such as $Al_2O_3$, HfAlO, HfAlON, or AlZrO; Hf-containing materials such as $HfO_2$, $HfSiO_x$, $HfAlO_x$, $HfZrSiO_x$, or HfSiON; and/or other materials such as $LaAlO_3$ or $ZrO_2$. In certain embodiments, the gate electrode layer 310 is formed on the gate dielectric layer 308, and may be formed of a conductive material such as doped polysilicon, metals, or metal nitrides. In some alternative embodiments, a dummy gate structure is formed across the fins 304 instead of the gate dielectric layer 308 and the gate electrode layer 310. In such embodiment, the dummy gate structure may be replaced in subsequent steps by the gate dielectric layer 308 and the gate electrode layer 310. Furthermore, in some embodiments, the fins 304 may be further etched to form source and drain on two sides of the gate electrode layer 310.

Figure 10B:
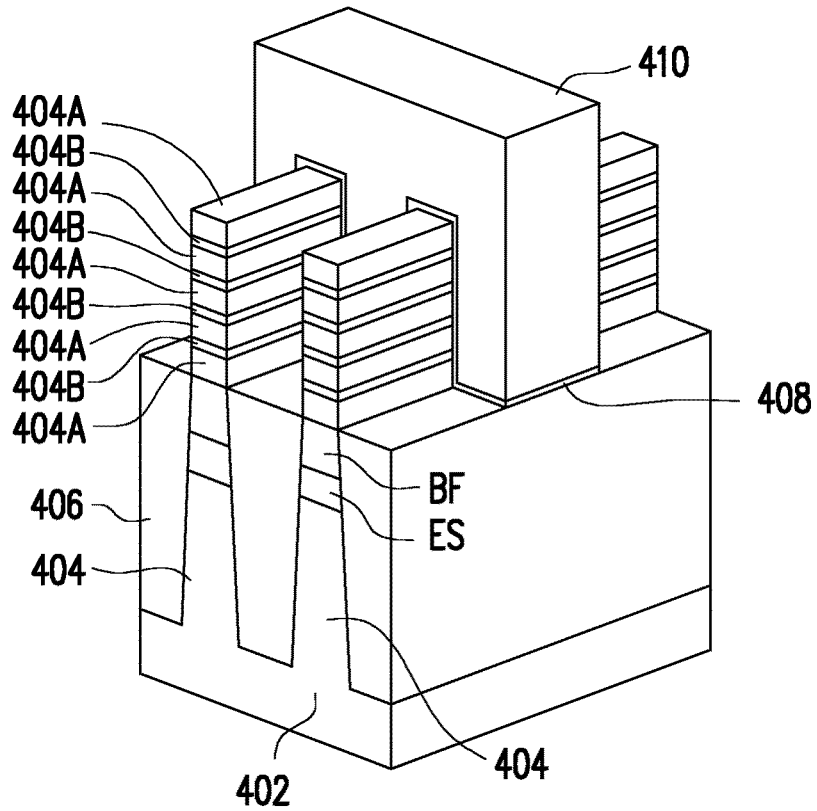
FIG. 10B is a three-dimensional perspective view of an example semiconductor device in accordance with some embodiments of the present disclosure.

FIG. 10B is a three-dimensional perspective view of an example semiconductor device in accordance with some embodiments of the present disclosure. In the exemplary method described above, the second layout LT2 is a nanosheet SRAM layout having the structures illustrated in FIG. 10B. For example, FIG. 10B is a perspective view of a multi-gate transistor device at an intermediate stage of fabrication. The multi-gate transistor device may also be referred to as a gate-all-around (GAA) device that provides a channel in a stacked nanosheet configuration. In other words, the device may have one or more channel regions (e.g., nanosheets) associated with a single, contiguous gate structure.

Referring to FIG. 10B, in some embodiments, the gate-all-around device includes a substrate 402 having a plurality of fins 404 disposed thereon. In some embodiments, the substrate 402 includes a silicon substrate, a silicon-on-insulator (SOI) substrate, a silicon germanium substrate, or a suitable semiconductor substrate. Other semiconductor materials including group III, group IV, and group V elements may also be used. The substrate 402 may also comprise various doped regions depending on design requirements (e.g., p-type substrate or n-type substrate). The disclosure is not limited thereto.

In some embodiments, parts of the fins 404 may be formed by etching the substrate 402. Furthermore, in some embodiments, an etch stop layer ES, a buffer layer BF and a plurality of alternately stacked epitaxial layers 404A and 404B may be sequentially formed over the substrate 402. In some embodiments, the etch stop layer ES, the buffer layer BF and the epitaxial layers 404A and 404B may be etched along with the substrate 402 to define the plurality of fins 404. In some exemplary embodiment, the etch stop layer ES is a layer that prevents the substrate 402 from being etched. In some embodiments, the etch stop layer ES may be a silicon carbide layer, while the buffer layer BF may be an undoped silicon layer. In some embodiments, the etch stop layer ES and the buffer layer BF may be omitted.

In some embodiments, a composition of the epitaxial layers 404A is different than a composition of the epitaxial layers 404B. For example, in one embodiment, the epitaxial layers 404A includes silicon germanium (SiGe), whereas the epitaxial layers 404B includes silicon. Although five epitaxial layers 404A and four epitaxial layers 404B are illustrated herein, it should be noted that the numbers of the epitaxial layers 404A and 404B are not limited thereto, and may be varied depending on the desired number of channel regions of the device. In some embodiments, channel members are the epitaxial layers 404B in the form of nanosheets. In certain embodiments, that fins 404 having the stacked epitaxial layers (404A and 404B) may correspond to the second active structures (or first nanosheet active structures) 212-1, 212-2 and third active structures (or second nanosheet active structures) 216-1A, 216-1, 216-2A, 216-2B illustrated in the second layout LT2 shown in FIG. 9.

As further illustrated in FIG. 10B, a plurality of insulators 406 may be formed on the substrate 402 in between the fins 404. In some embodiments, the insulators 406 covers a portion of the fins 404, while another portion of the fins 404 protrudes out from the insulators 406. For example, the epitaxial layers 404A and 404B protrudes out from the insulators 406 and are not covered up by the insulators 406.

In some embodiments, a dummy gate dielectric layer 408 and a dummy gate electrode layer 410 may be formed across the fins 404. For example, the dummy gate dielectric layer 408 and the dummy gate electrode layer 410 may be replaced with a gate dielectric layer and a gate electrode layer in subsequent steps. For example, the gate dielectric layer may include materials similar to that of the gate dielectric layer 308, while the gate electrode layer includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In certain embodiments, the fins 404 may be further etched to form source and drain on two sides of the gate electrode layer.

Figure 11:
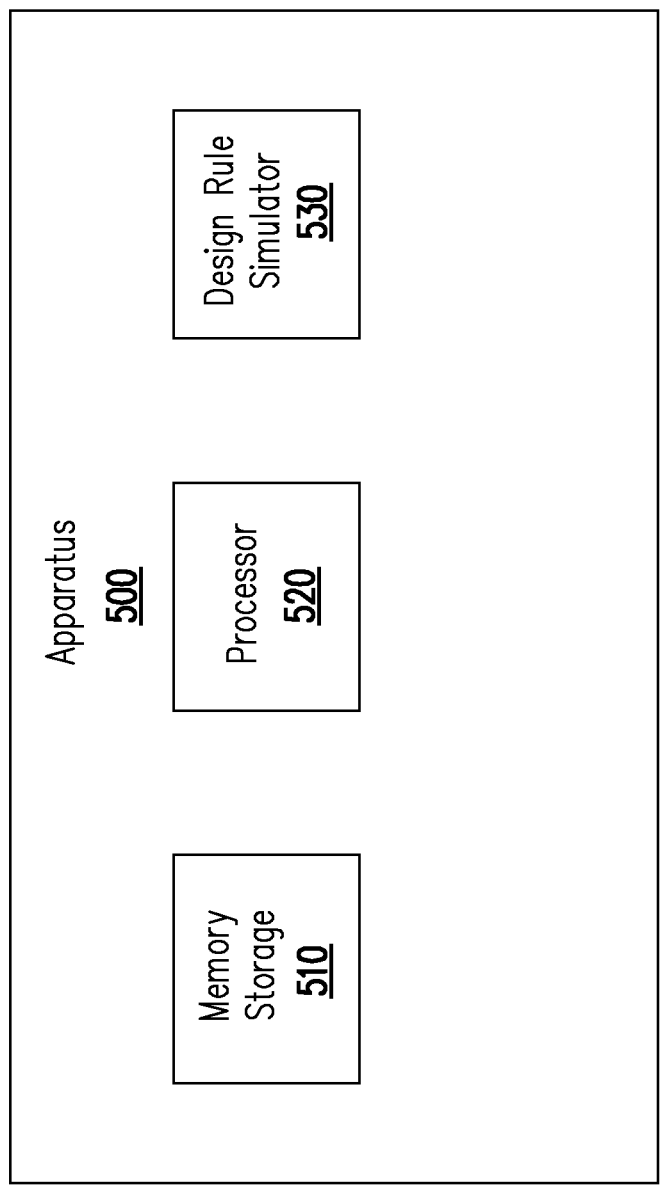
FIG. 11 is an exemplary diagram of an apparatus that can be used to generate the layout in accordance with some embodiments of the present disclosure.

FIG. 11 is an exemplary diagram of an apparatus that can be used to generate the layout in accordance with some embodiments of the present disclosure. Referring to FIG. 11, the apparatus 500 is, for example, an apparatus comprising a non-transitory, tangible computer readable storage medium storing a computer program for modifying a layout of a semiconductor device. In certain embodiments, the apparatus 500 is a layout generator that includes a machine or tool that can be used to perform the layout conversion process discussed above in association with FIGS. 2-9. In some embodiments, the apparatus includes a memory storage component 510, a processor component 520, and a design rule simulator 530. The memory storage component 510 is a non-transitory, tangible computer readable storage medium that stores instructions that can be executed by the processor 520. The instructions contain algorithms used to carry out the various steps of converting a FinFET SRAM layout (an initial layout) to a nanosheet SRAM layout. The processor 520 runs those instructions and generates the new layout having the gate-all-around (GAA) device (nanosheet structures).

In some embodiments, the generated new layout may be stored in the memory storage 510. The design rule simulator 530 includes hardware and software components that carry out the design rule check simulations discussed in association with FIG. 6 and FIG. 8. The design rule simulator 530 may also include the electronic database in which all the design rule check simulation results are stored. Alternatively, the design rule check simulation results may be stored in the memory storage 510. In some embodiments, the width of the active structures may be adjusted based on the design rule check simulation results. Furthermore, the new layout may be sent to a photomask fabricator so that photomasks corresponding to the new layout may be produced.

In the above-mentioned embodiments, a method of transforming a FinFET SRAM cell layout into a nanosheet SRAM cell layout is described. For products already being manufactured using conventional FinFET layouts, a conversion that includes changes to semiconductor layers above the transistor level would require many new photomasks to be created, which dramatically increases manufacturing cost. The described method allows the conversion of any verified FinFET SRAM layouts into a nanosheet SRAM layout that meet the requirements of nanosheet SRAM cells. The method is less time consuming and the generated layout can be easily verified.

In accordance with some embodiments of the present disclosure, a method of generating a layout for a semiconductor device is described. The method includes the following steps. A first layout is received, the first layout includes a first well region, a plurality of second well region and a plurality of first active structures. The plurality of first active structures is arranged in the first well region and the plurality of second well regions, wherein the plurality of first active structures extends along a first direction. A plurality of mandrel exposing regions is defined in the first layout, wherein each of the plurality of mandrel exposing regions are separated from one another, and the plurality of mandrel exposing regions corresponds to a position exposed by a mandrel used for forming the plurality of first active structures. A plurality of first mandrels is generated in the first well region and the plurality of second well regions outside of the plurality of mandrel exposing regions. A plurality of second active structures is generated to overlap with the plurality of first mandrels located in the second well regions, and a width of the plurality of second active structures is adjusted based on a first design rule check simulation. A plurality of second mandrels is generated in the first well region on two opposite sides of the first mandrels located in the first well region. A plurality of third active structures is generated to overlap with the plurality of second mandrels located in the first well region, and a width of the plurality of third active structures is adjusted based on a second design rule check simulation. The plurality of first mandrels, the plurality of second mandrels and the plurality of first active structures are removed. A second layout is generated based on the plurality of second active structures and the plurality of third active structures located in the plurality of second well regions and the first well region.

In accordance with some other embodiments of the present disclosure, a method of generating a layout for a static random access memory (SRAM) cell is described. The method includes the following steps. A fin field-effect transistor (FinFET) layout is received, the FinFET layout includes a first well region, two second well regions, first semiconductor fins and second semiconductor fins. The two second well regions are located on opposite sides of the first well region. The first semiconductor fins are located in the first well region and have a first conductivity type. The second semiconductor fins are located in the two second well regions and have a second conductivity type complementary to the first conductive type. A plurality of mandrel exposing regions is defined in the first layout, wherein each of the plurality of mandrel exposing regions are separated from one another, and the plurality of mandrel exposing regions corresponds to a position exposed by a mandrel used for forming the first semiconductor fins and the second semiconductor fins. A plurality of first mandrels is generated in the first well region and the two second well regions outside of the plurality of mandrel exposing regions. First nanosheet active structures are generated to overlap with the plurality of first mandrels located in the two second well regions, and a width of the first nanosheet active structures is adjusted based on a first design rule check simulation. A plurality of second mandrels is formed in the first well region on two opposite sides of the first mandrels located in the first well region. Second nanosheet active structures is generated to overlap with the plurality of second mandrels located in the first well region, and a width of the second nanosheet active structures is adjusted based on a second design rule check simulation. The plurality of first mandrels, the plurality of second mandrels, the first semiconductor fins and the second semiconductor fins are removed. A nanosheet SRAM layout is generated based on the first nanosheet active structures and the second nanosheet active structures located in the two second well regions and the first well region.

In accordance with yet another embodiment of the present disclosure, an apparatus comprising a non-transitory, tangible computer readable storage medium storing a computer program for modifying a layout of a semiconductor device is provided. The computer program of the apparatus has instructions that when executed, carries out the following steps. An initial layout plan is defined as an initial FinFET region, the initial FinFET region includes a first well region, a plurality of second well regions, and a plurality of first active structures. The plurality of first active structures is arranged in the first well region and the plurality of second well regions, wherein the plurality of first active structures extends along a first direction. A plurality of mandrel exposing regions is defined in the initial layout plan, wherein each of the plurality of mandrel exposing regions are separated from one another, and the plurality of mandrel exposing regions corresponds to a position exposed by a mandrel used for forming the plurality of first active structures. A plurality of first mandrels is generated in the first well region and the plurality of second well regions outside of the plurality of mandrel exposing regions. A plurality of second active structures is generated to overlap with the plurality of first mandrels located in the second well regions, and a width of the plurality of second active structures is adjusted based on a first design rule check simulation. A plurality of second mandrels is formed in the first well region on two opposite sides of the first mandrels located in the first well region. A plurality of third active structures is generated to overlap with the plurality of second mandrels located in the first well region, and a width of the plurality of third active structures is adjusted based on a second design rule check simulation. The plurality of first mandrels, the plurality of second mandrels and the plurality of first active structures are removed. A modified layout is generated based on the plurality of second active structures and the plurality of third active structures located in the plurality of second well regions and the first well region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating a layout for a semiconductor device, comprising:
   receiving a first layout, wherein the first layout comprises:
      a first well region and a plurality of second well regions; and
      a plurality of first active structures arranged in the first well region and the plurality of second well regions, wherein the plurality of first active structures extends along a first direction;
   defining a plurality of mandrel exposing regions in the first layout, wherein each of the plurality of mandrel exposing regions are separated from one another, and the plurality of mandrel exposing regions corresponds to a position exposed by a mandrel used for forming the plurality of first active structures;
   generating a plurality of first mandrels in the first well region and the plurality of second well regions outside of the plurality of mandrel exposing regions;
   generating a plurality of second active structures that overlaps with the plurality of first mandrels located in the second well regions, and adjusting a width of the plurality of second active structures based on a first design rule check simulation;
   generating a plurality of second mandrels in the first well region on two opposite sides of the first mandrels located in the first well region;
   generating a plurality of third active structures that overlaps with the plurality of second mandrels located in the first well region, and adjusting a width of the plurality of third active structures based on a second design rule check simulation;
   removing the plurality of first mandrels, the plurality of second mandrels and the plurality of first active structures; and
   generating a second layout based on the plurality of second active structures and the plurality of third active structures located in the plurality of second well regions and the first well region.

2. The method according to claim 1, further comprising adjusting boundaries of the first well region and the plurality of second well regions based on positions of the plurality of second active structures and the plurality of third active structures, so that a width of the first well region is substantially equal to a width of the plurality of second well regions.

3. The method according to claim 1, wherein the first layout includes two second well regions, and generating the plurality of second active structures includes generating one second active structure in each of the second well regions.

4. The method according to claim 1, wherein generating the plurality of third active structures includes generating two third active structures in the first well region.

5. The method according to claim 1, wherein the first layout includes at least two first active structures in each of the first well region and the plurality of second well regions.

6. The method according to claim 1, wherein prior to generating the second layout, the method further comprises sectioning the plurality of third active structures, and defining two pull-up transistors on the plurality of third active structures, and defining two pull-down transistors and two pass-gate transistors on the plurality of second active structures.

7. The method according to claim 1, wherein the first design rule check simulation includes checking boundaries and the width of the plurality of second active structures so as to avoid a first number of nanosheet FinFET design rule violations associated with the second well regions, and the second design rule check simulation includes checking boundaries and the width of the plurality of third active structures so as to avoid a second number of nanosheet FinFET design rule violations associated with the first well region.

8. A method of generating a layout for a static random access memory (SRAM) cell, comprising:
  receiving a fin field-effect transistor (FinFET) layout, wherein the FinFET layout comprises:
    a first well region and two second well regions located on opposite sides of the first well region;
    first semiconductor fins having a first conductive type located in the first well region; and
    second semiconductor fins having a second conductive type complementary to the first conductive type and located in the two second well regions;
  defining a plurality of mandrel exposing regions in the FinFET layout, wherein each of the plurality of mandrel exposing regions are separated from one another, and the plurality of mandrel exposing regions corresponds to a position exposed by a mandrel used for forming the first semiconductor fins and the second semiconductor fins;
  generating a plurality of first mandrels in the first well region and the two second well regions outside of the plurality of mandrel exposing regions;
  generating first nanosheet active structures that overlaps with the plurality of first mandrels located in the two second well regions, and adjusting a width of the first nanosheet active structures based on a first design rule check simulation;
  forming a plurality of second mandrels in the first well region on two opposite sides of the first mandrels located in the first well region;
  generating second nanosheet active structures that overlaps with the plurality of second mandrels located in the first well region, and adjusting a width of the second nanosheet active structures based on a second design rule check simulation;
  removing the plurality of first mandrels, the plurality of second mandrels, the first semiconductor fins and the second semiconductor fins; and
  generating a nanosheet SRAM layout based on the first nanosheet active structures and the second nanosheet active structures located in the two second well regions and the first well region.

9. The method according to claim 8, further comprising adjusting boundaries of the first well region and the two second well regions based on positions of the first nanosheet active structures and the second nanosheet active structures, so that a width of the first well region is substantially equal to a width of the two second well regions.

10. The method according to claim 8, wherein generating the first nanosheet active structures includes generating one first nanosheet active structure in each of the second well regions.

11. The method according to claim 8, wherein generating the second nanosheet active structures includes generating two second nanosheet active structure in the first well region.

12. The method according to claim 8, wherein the FinFET layout includes at least two first semiconductor fins in the first well region, and two second semiconductor fins in each of the second well regions.

13. The method according to claim 8, wherein prior to generating the nanosheet SRAM layout, the method further comprises sectioning the second nanosheet active structures, and defining two pull-up transistors on the second nanosheet active structures, and defining two pull-down transistors and two pass-gate transistors on the first nanosheet active structures.

14. The method according to claim 8, wherein adjusting the width of the first nanosheet active structures based on the first design rule check simulation includes increasing the width of the first nanosheet active structures so that it is greater than a width of the plurality of first mandrels.

15. The method according to claim 8, wherein adjusting the width of the second nanosheet active structures based on the second design rule check simulation includes increasing the width of the second nanosheet active structures so that it is greater than a width of the plurality of second mandrels.

16. The method according to claim 8, wherein the first design rule check simulation includes checking boundaries and the width of the first nanosheet active structures so as to avoid a first number of nanosheet FinFET design rule violations associated with the second well regions, and the second design rule check simulation includes checking boundaries and the width of the second nanosheet active structures so as to avoid a second number of nanosheet FinFET design rule violations associated with the first well region.

17. An apparatus comprising a non-transitory, tangible computer readable storage medium storing a computer program for modifying a layout of a semiconductor device, wherein the computer program has instructions that when executed, carries out:
  defining an initial layout plan as an initial FinFET region, the initial FinFET region includes a first well region and a plurality of second well regions, and a plurality of first active structures arranged in the first well region and the plurality of second well regions, wherein the plurality of first active structures extends along a first direction;
  defining a plurality of mandrel exposing regions in the initial layout plan, wherein each of the plurality of mandrel exposing regions are separated from one another, and the plurality of mandrel exposing regions corresponds to a position exposed by a mandrel used for forming the plurality of first active structures;
  generating a plurality of first mandrels in the first well region and the plurality of second well regions outside of the plurality of mandrel exposing regions;
  generating a plurality of second active structures that overlaps with the plurality of first mandrels located in the second well regions, and adjusting a width of the plurality of second active structures based on a first design rule check simulation;
  forming a plurality of second mandrels in the first well region on two opposite sides of the first mandrels located in the first well region;
  generating a plurality of third active structures that overlaps with the plurality of second mandrels located in the first well region, and adjusting a width of the plurality of third active structures based on a second design rule check simulation;

removing the plurality of first mandrels, the plurality of second mandrels and the plurality of first active structures; and generating a modified layout based on the plurality of second active structures and the plurality of third active structures located in the plurality of second well regions and the first well region.

18. The apparatus according to claim 17, further comprising adjusting boundaries of the first well region and the plurality of second well regions based on positions of the plurality of second active structures and the plurality of third active structures, so that a width of the first well region is substantially equal to a width of the plurality of second well regions.

19. The apparatus according to claim 17, wherein prior to generating the modified layout, the method further comprises sectioning the plurality of third active structures, and defining two pull-up transistors on the plurality of third active structures, and defining two pull-down transistors and two pass-gate transistors on the plurality of second active structures.

20. The apparatus according to claim 17, wherein the first design rule check simulation includes checking boundaries and the width of the plurality of second active structures so as to avoid a first number of nanosheet FinFET design rule violations associated with the second well regions, and the second design rule check simulation includes checking boundaries and the width of the plurality of third active structures so as to avoid a second number of nanosheet FinFET design rule violations associated with the first well region.

\* \* \* \* \*